United States Patent
Tate et al.

[11] Patent Number: 6,072,164
[45] Date of Patent: Jun. 6, 2000

[54] HEAT-TREATING METHOD AND RADIANT HEATING DEVICE

[75] Inventors: Naoto Tate, Vancouver, Wash.; Tomoyuki Sakai, Tokyo, Japan; Naohisa Toda; Hitoshi Habuka, both of Gunma-ken, Japan

[73] Assignee: Shin-Estu Handotai Co., Ltd., Tokyo, Japan

[21] Appl. No.: 09/142,646

[22] PCT Filed: Mar. 10, 1997

[86] PCT No.: PCT/JP97/00734

§ 371 Date: Sep. 11, 1998

§ 102(e) Date: Sep. 11, 1998

[87] PCT Pub. No.: WO97/34318

PCT Pub. Date: Sep. 18, 1997

[30] Foreign Application Priority Data

Mar. 12, 1996 [JP] Japan ..................................... 8-083327

[51] Int. Cl.[7] ...................................................... H05B 1/02
[52] U.S. Cl. ......................... 219/497; 505/494; 392/416; 374/126; 374/128
[58] Field of Search ............................... 219/121.43, 497, 219/501, 505, 494; 392/416; 374/126, 128, 120–122; 118/723–725; 156/345

[56] References Cited

U.S. PATENT DOCUMENTS

| | | |
|---|---|---|
| 4,956,538 | 9/1990 | Moslehi . |
| 5,114,242 | 5/1992 | Gat et al. ................................ 374/128 |
| 5,156,461 | 10/1992 | Moslehi et al. .......................... 374/126 |
| 5,359,693 | 10/1994 | Nenyei et al. . |
| 5,377,126 | 12/1994 | Filk et al. . |
| 5,443,315 | 8/1995 | Lee et al. . |
| 5,755,511 | 5/1998 | Peuse et al. ............................. 374/128 |
| 5,823,681 | 10/1998 | Cabib et al. ............................. 118/724 |
| 5,830,277 | 11/1998 | Johnsgard et al. ...................... 118/725 |

FOREIGN PATENT DOCUMENTS

| | | |
|---|---|---|
| 0 452 773 | 10/1991 | European Pat. Off. . |
| 62-102123 | 5/1987 | Japan . |
| 62-110127 | 5/1987 | Japan . |
| 62-296512 | 12/1987 | Japan . |
| 3165514 | 7/1991 | Japan . |
| 4000713 | 1/1992 | Japan . |
| 4048724 | 2/1992 | Japan . |
| 7218345 | 8/1995 | Japan . |
| 7240378 | 9/1995 | Japan . |
| 7286904 | 10/1995 | Japan . |

OTHER PUBLICATIONS

Nulman, J. "Emissivity Issues in Pyrometric Temperature Monitoring for RTP Systems," SPIE Proceedings, International Society for Optical Engineering, vol. 1189 (1990), pp. 72–82.

*Primary Examiner*—Mark Paschall
*Attorney, Agent, or Firm*—Loeb & Loeb, LLP

[57] ABSTRACT

There is provided a heat-treating method and a radiant heating device by which an object to be heat-treated can be heat-treated at an actually desired temperature regardless of the dopant concentration or resistivity of the object at the time of heat-treating the object with a radiant heating device using a radiation thermometer as a temperature detector. In the method, the object is heat-treated at an actually desired temperature by correcting the temperature of the object in accordance with the dopant concentration or resistivity of the object. In the apparatus, the dopant concentration or resistivity of the object is inputted in advance to a temperature controller and the controller calculates an actual temperature of the object by correcting and computing the temperature of the object detected with the radiation thermometer in accordance with the dopant concentration or resistivity of the object and controls the temperature of the object based on the calculated temperature value.

11 Claims, 2 Drawing Sheets

HEAT-TREATING METHOD AND RADIANT HEATING DEVICE

CROSS-REFERENCE TO RELATED APPLICATION

This application claims priority based on PCT Application Ser. No. PCT/JP97/00734, filed Mar. 10, 1997 identifying the United States as an elected country, which in turn claims priority based on Japanese Patent Application No. 8-83327, filed Mar. 12, 1996.

1. Field of the Invention

The present invention relates to a heat-treating method and a radiant heating device by which an object to be heat-treated can be heat-treated at an actually desired temperature at the time of heat-treating the object with a radiant heating device, particularly, at the time of performing various kinds of heat treatments, growing a CVD film, performing epitaxial growth, or performing like processes on a semiconductor silicon single-crystal substrate having a low resistivity.

2. Background Art

Semiconductor devices are manufactured by performing various kinds of heat treatments on, for example, silicon single-crystal substrates, compound semiconductor single-crystal substrates, or like substrates which serve as objects to be heat-treated. In order to subject these objects to various kinds of heat treatments, CVD film growth, epitaxial growth, or like processes, a radiant heating device is often used.

FIG. 1 shows a schematic configuration of a conventionally used radiant heating device. A radiant heating device 1 is constituted such that a reaction vessel 8 formed of, for example, transparent quartz accommodates an object 2 to be heat-treated, such as a semiconductor substrate or the like, and the object 2 is heated through irradiation with energy emitted in the form of radiant light from a radiant heating unit 3 disposed outside the reaction vessel 8. The radiant heating unit is composed of, for example, radiant heating lamps 9, such as halogen lamps, infrared lamps, or like lamps, and mirrors 10 for enhancing directivity of radiant light.

In order to detect the temperature of the object, a thermocouple or a radiation thermometer is used. Since use of the radiation thermometer enables temperature measurement from outside the reaction vessel, the radiation thermometer is convenient. The radiation thermometer is composed of a detector 5 and a temperature converter 6. The detector 5 detects radiant light emitted from the object and sends the intensity of the detected radiant light to the temperature converter 6, which converts the received intensity to temperature. The thus-obtained temperature (in actuality, a voltage or current value corresponding to the temperature) is outputted to a temperature controller 7. Power fed to the radiant heating lamps 9 is regulated such that the temperature detected with the radiation thermometer becomes equal to a previously inputted set temperature (a temperature previously set and inputted to the temperature controller), thereby maintaining the object 2 at a desired temperature.

According to an example method for heat-treating the object through use of the thus-constituted radiant heating device, while a reactive gas 4 consisting of a carrier gas and a reactive material is made to flow on the front surface side of a semiconductor substrate 2, the semiconductor substrate 2 is heated to a desired temperature; for example, 800–1200° C., with the radiant heating unit 3. Through chemical reaction of the reactive gas 4, a desired thin film can be grown on the surface of the substrate 2.

In this case, needless to say, if the temperature of the object to be heat-treated is not actually a desired temperature, various desired quality characteristics of the produced thin film, such as thickness, electrical characteristics, crystalline properties, etc., will fail to be attained. Also, the properties of the object affect an actually reached temperature of the object, causing the reached temperature to deviate from a set temperature. Such a temperature deviation comes out in the form of variations in quality characteristics of the produced thin film. This problem is not limited to the above-mentioned growth of a thin film, but is commonly involved in heat treatment of the object.

Accordingly, when an object is to be heat-treated, agreement between a desired temperature of the object and an actual temperature of the object is important. Particularly, due care must be taken when, in the above-mentioned radiant heating device, as in the case of using a radiation thermometer, the temperature of the object is indirectly measured from outside the reaction vessel instead of the temperature of the object being directly measured.

In a conventional heat-treating method using a radiant heating device as represented by the one of FIG. 1, a set temperature for an object to be heat-treated is programmed through input of a desired value to the control circuit of a temperature controller. However, properties of the object, particularly, such a factor as the resistivity or dopant concentration of the object, has not been taken into consideration, in view that such factors are considered to be unrelated to an reached temperature of the object. Accordingly, a set temperature for the object has been determined irrespective of the resistivity or dopant concentration of the object, and the object has been believed to be heat-treated at the set temperature.

In the production of silicon semiconductor single-crystal thin films by epitaxial growth for microprocessor use, silicon semiconductor single-crystal substrates of p-type having a very low resistivity (not higher than 0.01 $\Omega \cdot cm$) have been preferred in recent years. According to recent findings, even when single-crystal thin films are produced under the same conditions, characteristics differ between a single-crystal thin film produced on a substrate having a conventionally employed resistivity (0.01 $\Omega \cdot cm$ to 10 $\Omega \cdot cm$) and a single-crystal thin film produced on a substrate having the above-mentioned very low resistivity.

That is, the following has been found. The resistivity or dopant concentration of a substrate serving as an object to be heat-treated influences the conditions of heat treatment like as epitaxial growth. Specifically, the resistivity or dopant concentration of the object causes a change in the radiation coefficient of the object, resulting in disagreement between a measured value obtained through a radiation thermometer and an actual temperature of the object.

The present invention has been accomplished in view of the above-mentioned problems, and an object of the invention is to provide a heat-treating method and a radiant heating device by which an object to be heat-treated can be heat-treated after the object is heated to an actually desired temperature regardless of the dopant concentration or resistivity of the object at the time of heat-treating the object with a radiant heating device using a radiation thermometer as a temperature detector.

SUMMARY OF THE INVENTION

To solve the above-mentioned problems, the inventors of the present invention employ a method of regulating heat treatment conditions or measurement data in accordance with the dopant concentration or resistivity of an object to be heat-treated at the time of heat-treating the object with a radiant heating device. A first embodiment of the present invention is directed to a heat-treating method by which an object to be heat-treated is heat-treated with a radiant heating device using a radiation thermometer as a temperature detector, characterized in that the object is heat-treated at an actually desired temperature by correcting the temperature of the object in accordance with the dopant concentration or resistivity of the object.

Through correction of the temperature of the object in accordance with the dopant concentration or resistivity of the object which has not been conventionally considered a condition of heat treatment, the object can be heat-treated at the actually desired temperature. As a result, a produced thin film or the like attains desired quality characteristics.

A second embodiment of the present invention described in claim 2 relates to the heat-treating method according to the first embodiment and is characterized in that the above-mentioned temperature correction is performed by modifying a set value of temperature to which the object is reached in accordance with the difference between an actual temperature of the object and a measured value obtained through the radiation thermometer, the difference being determined in advance for the dopant concentration or resistivity of the object. Further, a third embodiment of the present invention relates to a heat-treating method according to the first embodiment and is characterized in that the above-mentioned temperature correction is performed by modifying a measured value obtained through the radiation thermometer in accordance with the difference between an actual temperature of the object and the measured value obtained through the radiation thermometer, the difference being determined in advance for the dopant concentration or resistivity of the object.

Thus, through modification of a set value of temperature to be controlled and through temperature control for attainment of the modified set value, the temperature of the object can be controlled to an actually desired temperature. Alternatively, through modification of a measured value obtained through the radiation thermometer to thereby obtain an actual temperature of the object, the temperature of the object can be controlled based on the obtained actual temperature of the object.

A fourth, a fifth and a sixth embodiment of the present invention relate to the heat-treating method according to the first, second and third embodiments. The fourth embodiment is characterized in that the object is a silicon single-crystal substrate, whose dopant concentration is not lower than $1 \times 10^{19}$ atoms/cm$^3$ and not higher than the maximum solubility of the dopant in silicon. The fifth embodiment is characterized in that the object is a p-type silicon single-crystal substrate, whose dopant concentration is not higher than the maximum solubility of the dopant in silicon and whose resistivity is not higher than 0.01 Ω·cm. The sixth embodiment is characterized in that the heat treatment is the vapor-phase growth of a silicon single-crystal thin film on a silicon single-crystal substrate.

Thus, the heat-treating method of the present invention is effective in the correction of a change in radiation coefficient of a silicon single-crystal substrate doped with a dopant at a high concentration at the time of heat-treating the substrate as an object to be heat-treated, which change arises in accordance with the dopant concentration or resistivity of the substrate. Particularly, when a silicon single-crystal thin film is vapor-phase-grown on the silicon single-crystal substrate, the thus produced thin film is required to have high quality characteristics; thus, the substrate to be heat-treated must be heated to an actually desired temperature.

A seventh and an eighth embodiment of the invention relate to a radiant heating device comprising at least a reaction vessel for accommodating an object to be heat-treated, a radiant heating lamp for heating the object, a radiation thermometer for detecting the temperature of the object, and a temperature controller for regulating power fed to the radiant heating lamp such that the temperature detected with the radiation thermometer becomes equal to a previously inputted set temperature.

The seventh embodiment is characterized in that the dopant concentration or resistivity of the object is inputted in advance to the temperature controller and the controller calculates an actual temperature of the object by correcting and computing the temperature of the object detected with the above-mentioned radiation thermometer in accordance with the dopant concentration or resistivity of the object and controls the temperature of the object based on the calculated temperature value.

The eighth embodiment is characterized in that the above-mentioned radiation thermometer is adapted to calculate an actual temperature of the object by correcting and computing the temperature of the object detected with the radiation thermometer in accordance with the dopant concentration or resistivity of the object inputted in advance to the radiation thermometer and to output the calculated temperature value to the temperature controller.

As mentioned above, when a radiant heating device using a radiation thermometer as a temperature detector is constituted such that the dopant concentration or resistivity of an object to be heat-treated is inputted in advance to a temperature controller or the temperature converter of the radiation thermometer and the controller or converter performs control by correcting and computing the detected temperature in accordance with the dopant concentration or resistivity of the object, the object, even when having a low resistance, can be heat-treated at an actually desired temperature without being affected by the dopant concentration or resistivity of the object.

That is, the present invention provides a heat-treating method and a radiant heating device by which an object to be heat-treated can be heat-treated at an actually desired temperature regardless of the dopant concentration or resistivity of the object at the time of heat-treating the object with a radiant heating device using a radiation thermometer as a temperature detector.

Accordingly, even when a substrate having a low resistivity is used as an object to be heat-treated, the object can always and readily be heat-treated at an actually desired temperature without being affected by the dopant concentration or resistivity of the object.

Thus, with prospective higher integration and precision of semiconductor substrates and an associated requirement for higher accuracy in heat treatment in a semiconductor substrates producing process, the heat-treating method and the radiant heating device of the present invention are highly useful for subjecting semiconductor substrates to various kinds of heat treatments, CVD film growth, epitaxial film growth, or like processes.

DETAILED DESCRIPTION OF THE PREFERRED EMBODIMENTS

The present invention will next be described in detail, which should not be construed as limiting the invention.

The inventors of the present invention studied the relation between the resistivity of a substrate serving as an object to be heat-treated and radiant light emitted from the object. As a result, the inventors found that a silicon semiconductor single-crystal substrate having a low resistivity (not higher than 0.01 Ω·cm), which has been preferred in recent years, has a larger light absorptance (i.e., a larger radiation coefficient) than does a silicon semiconductor single-crystal substrate having a conventionally employed resistivity (0.01 Ω·cm to 10 Ω·cm). This feature revealed that the resistivity or dopant concentration of a silicon semiconductor single-crystal substrate influences a measured value detected through a radiation thermometer at the time of heat treatment, thus revealing that a substrate having a low resistivity is heat-treated at a temperature different from a set temperature with a resultant variation in characteristics of a produced epitaxial thin film or the like.

As mentioned previously, the radiation thermometer is composed of a detector and a temperature converter. The detector detects radiant light emitted from the object and sends the intensity of the detected radiant light to the temperature converter, which converts the intensity to temperature. In this conversion to temperature, the emissivity of the object (absorptance) is inputted to the temperature converter and the converter calculates temperature through use of the inputted emissivity. The emissivity is normally stored as a constant value in the temperature converter. Accordingly, when the emissivity of a substrate serving as the object varies with the dopant concentration or resistivity of the substrate, conversion to temperature cannot be carried out accurately, resulting in disagreement between a detected temperature obtained through the radiation thermometer and an actual temperature of the object.

In the process of attempting to solve the problem, the present inventors reached the inventive concept that through correction of the temperature of the object in accordance with the dopant concentration or resistivity of the object, the object is heat-treated at a desired temperature in a simple and accurate manner, thus achieving the present invention.

Figure 1:
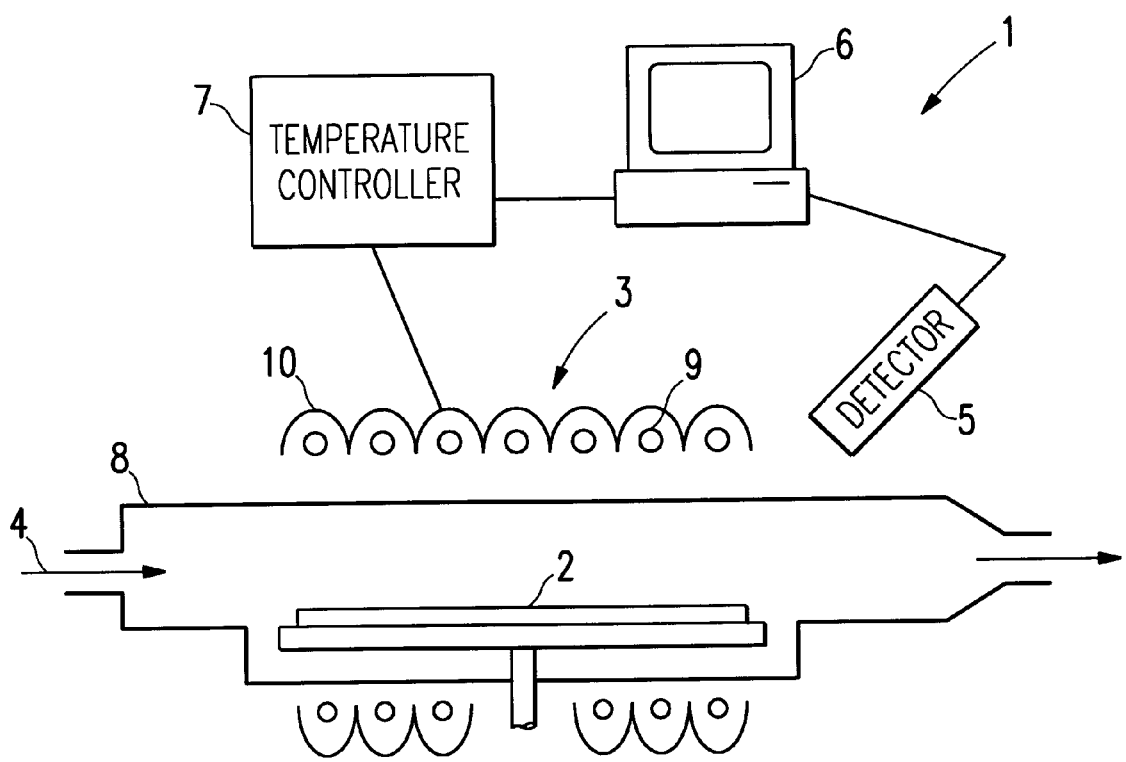
FIG. 1 is a schematic view showing the configuration of a radiant heating device.

An embodiment of the present invention will now be described in detail with reference to FIG. 1.

As in the case of a conventional radiant heating device, a radiant heating device of the present invention is constituted such that a reaction vessel 8 formed of, for example, transparent quartz accommodates an object 2 to be heat-treated, such as a semiconductor substrate or the like, and the object 2 can be heated through irradiation with energy emitted in the form of radiant light from a radiant heating unit 3 disposed outside the reaction vessel 8. The above-mentioned radiant heating unit is composed of, for example, radiant heating lamps 9, such as halogen lamps, infrared lamps, or like lamps, and mirrors 10 for enhancing directivity of radiant light.

In order to detect the temperature of the object, a radiation thermometer disposed outside the reaction vessel 8 is used. The radiation thermometer is composed of a detector 5 and a temperature converter 6. The detector 5 detects radiant light emitted from the object and sends the intensity of the detected radiant light to the temperature converter 6, which converts the received intensity to temperature. The thus-obtained temperature is outputted to a temperature controller 7. Power fed to the radiant heating lamps 9 is regulated such that the temperature detected with the radiation thermometer becomes equal to a set temperature previously inputted to the temperature controller 7, thereby maintaining the object 2 at a desired temperature.

These features are basically similar to those of the conventional device.

The radiant heating device of the present invention is characterized in that a dopant concentration or resistivity of the object can be inputted in advance to the temperature controller 7 or the temperature converter 6 of the radiation thermometer so that the temperature of the object can be controlled by correcting and computing a detected temperature of the object in accordance with the inputted value.

Specifically, according to a first embodiment of the device of the present invention, dopant concentration or resistivity of the object 2 can be inputted in advance to the temperature controller 7, and the controller 7 calculates an actual temperature of the object by correcting and computing the temperature of the object 2 (in actuality, current or voltage) inputted from the radiation thermometer in accordance with the inputted dopant concentration or resistivity of the object 2 and controls the temperature of the object 2 such that the calculated temperature value becomes equal to a set temperature.

Next, according to a second embodiment of the device of the present invention, dopant concentration or resistivity of the object 2 can be inputted in advance to the temperature converter 6 of the radiation thermometer, and the converter 6 calculates an actual temperature of the object by correcting and computing the detected temperature of the object in accordance with the inputted dopant concentration or resistivity of the object 2 at the time of converting the data inputted from the detectors to temperature and outputs the calculated temperature value to the temperature controller 7.

According to the above-described radiant heating device of the present invention using a radiation thermometer as a temperature detector, the dopant concentration or resistivity of an object to be heat-treated can be inputted in advance to the temperature controller or the temperature converter of the radiation thermometer, and the temperature of the object can be controlled by correcting and computing a detected temperature of the object in accordance with the inputted dopant concentration or resistivity of the object. Thus, even when a substrate having a low resistivity is used as the object, the object can always and readily be heat-treated at an actually desired temperature without being affected by the dopant concentration or resistivity of the object.

Next will be described by way of example a temperature correction method and a temperature correction value employed in the device and heat-treating method of the present invention for heat-treating an object at an actually desired temperature regardless of the resistivity or dopant concentration of the object. In this example, a silicon single-crystal substrate having a diameter of 200 mm is used as the object 2. While a reactive gas consisting of chlorosilane and hydrogen serving as carrier gas is introduced into the radiant heating unit 3, the silicon single-crystal substrate is heated to a temperature of about 800° C. to 1200° C. in the radiant heating unit 3 so as to grow an epitaxial layer of a silicon single-crystal thin film on the silicon single-crystal substrate.

First, in order to correct the temperature of the silicon single-crystal substrate 2 in accordance with the dopant concentration or resistivity of the silicon single-crystal substrate 2, a calibration curve must be prepared which shows a correction value with respect to the dopant concentration or resistivity of the silicon single-crystal substrate 2.

The temperature of the silicon single-crystal substrate 2 is corrected in accordance with the thus-obtained calibration curve. Accordingly, a correction value for the dopant concentration or resistivity of the silicon single-crystal substrate 2 is inputted in advance to the temperature controller 7 or the temperature converter 6 of the radiation thermometer. Thus, the silicon single-crystal substrate 2 can be heat-treated at an actually desired temperature by automatically correcting the temperature of the substrate 2.

In this case, as described above, the dopant concentration or resistivity of the single-crystal substrate 2 and the calibration curve may be inputted to the temperature controller 7 or the temperature converter 6 of the radiation thermometer so as to automatically correct the temperature of the substrate 2. Alternatively, a set value of temperature to reach may be corrected in accordance with the above-mentioned calibration curve and the corrected set value may be inputted to the temperature controller. This also yields similar effect.

Figure 2:
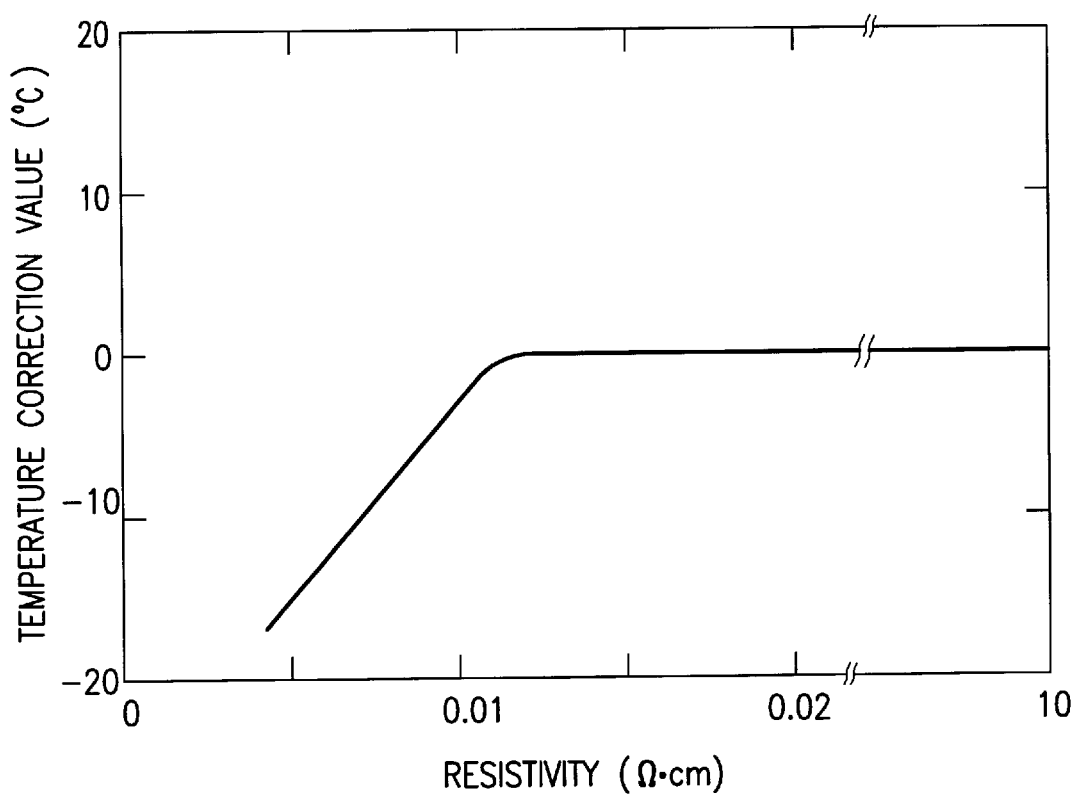
FIG. 2 is a graph showing an example of a calibration curve used for correction of temperature in the present invention, illustrating resistivity vs. temperature correction value.

FIG. 2 shows a typical example of a calibration curve illustrating resistivity vs. temperature correction value for the silicon single-crystal substrate 2.

The calibration curve shows a temperature correction value to be added to a measured value obtained through a radiation thermometer with respect to the resistivity of the p-type silicon single-crystal substrate 2. The calibration curve was obtained in the following manner. In the radiant heating device, a thermocouple and a radiation thermometer were concurrently used as temperature detectors. The thermocouple was brought in direct contact with the silicon single-crystal substrate 2 so as to directly measure the temperature of the substrate as much as possible. The silicon single-crystal substrate 2 was heated to 1150° C., and the calibration curve was obtained from the difference between measured values obtained through the thermocouple and those obtained through the radiation thermometer.

As seen from the calibration curve, no correction is required over a wide range of resistivity not lower than about 0.012 Ω·cm. However, correction is required at a resistivity not higher than 0.01 Ω·cm (dopant concentration not lower than $1 \times 10^{19}$ atoms/cm$^3$); otherwise, a temperature deviation not smaller than 10° C. occurs in a worse case.

Accordingly, when a silicon single-crystal substrate having a resistivity not higher than 0.01 Ω·cm (dopant concentration not lower than $1 \times 10^{19}$ atoms/cm$^3$ and not higher than the maximum solubility of the dopant in silicon), which has particularly been preferred as an object to be heat-treated in recent years, is heat-treated for vapor-phase-growing a silicon single-crystal thin film to grow an epitaxial layer on the substrate with a radiant heating device using a radiation thermometer as a temperature detector, the temperature of the substrate must be corrected in accordance with the calibration curve of FIG. 2.

In this case, a question may arise that when an epitaxial layer having a resistivity different from that of the low-resistivity silicon single-crystal substrate is grown on the substrate, measurement accuracy may suffer a new error. It is true that the emissivity of an epitaxial layer grown on the substrate surface is different from the emissivity of the substrate. However, since radiant light which the radiation thermometer detects is the one emitted from the entire silicon single-crystal substrate as an object, the influence of a thin film grown on the substrate surface is negligibly small. The influence of a grown layer may be considered only when the layer is unignorably thick in comparison with the thickness of a substrate. Even in such a case, since the resistivity and growth rate of an epitaxial layer to be grown are known, the emissivity of the substrate can be taken as a function of time and corrected accordingly. Thus, the emissivity data may be inputted to the temperature controller or the temperature converter of the radiation thermometer to correctively compute by the controller or the converter.

The present invention is not limited to the above-described embodiment. The above-described embodiment is a mere example, and those having the substantially same structure as that described in the appended claims and providing the similar action and effects are included in the scope of the present invention.

For example, the above embodiment is described while the detected temperature of an object to be heat-treated is corrected by either of the following methods: the dopant concentration or resistivity of the object and a calibration curve are inputted to the temperature controller 7 or the temperature converter 6 of the radiation thermometer so as to automatically perform temperature correction; and a set value of temperature to reach is corrected in accordance with a calibration curve, and the corrected set value is inputted into the temperature controller. The present invention is not limited thereto. Similar actions and effects are yielded through correction of power fed to the radiant heating lamps, correction of the emissivity of silicon inputted to the temperature converter of the radiation thermometer, or like corrective processes.

Also, the above embodiment is described while, as an example, an epitaxial layer is grown on a silicon single-crystal substrate having a diameter of 200 mm. However, the present invention is not limited thereto. Needless to say, similar actions and effects are yielded when the present invention is applied to heat treatment of large-diameter silicon single-crystal substrates having a diameter not smaller than 300 mm or not smaller than 400 mm as well as heat treatment of silicon single-crystal substrates having a diameter not greater than 150 mm.

Further, the above embodiment is described while, as an example, the calibration curve is prepared in order to obtain a temperature correction value to be used for temperature correction for the resistivity of a p-type (boron dope) silicon single-crystal substrate. However, the present invention is not limited thereto. Similar actions and effects are yielded when a calibration curve is prepared in a manner similar to that of the embodiment through obtainment of temperature correction values to be used for temperature correction for the resistivity of an n-type (for example, phosphorus, antimony, or arsenic dope) silicon single-crystal substrate. Needless to say, similar actions and effects are yielded when a calibration curve is prepared for the dopant concentration, not the resistivity, of a substrate.

Also, an object to be heat-treated with the device of the present invention is not particularly limited. In addition to semiconductor silicon and various compound semiconductors, various kinds of oxide single-crystal and the like may be heat-treated with the device of the present invention so long as the device is applicable to such heat treatment.

Further, heat treatment to be performed on an object to be heat-treated with the device of the present invention is not particularly limited. The device of the present invention can be used for various kinds of heat treatments. Examples of such heat treatment include epitaxial film growth and CVD film growth as well as heat treatment performed in a device process and the like, such as so-called annealing, hydrogen heat treatment, oxygen heat treatment, nitrogen heat treatment, and dopant diffusion.

Still further, according to the present embodiment, the objects 2 are heat-treated one by one, i.e., so-called single-object processing is employed. However, a plurality of objects may be heat-treated at a time. In this case, "an object to be heat-treated" appearing in the claims of the present application refers to the entire set of objets to be heat-treated at a time. The dopant concentration or resistivity values of the objects must be identical to or approximate to each other.

What is claimed is:

1. A heat-treating method by which an object to be heat-treated is heat-treated with a radiant heating device using a radiation thermometer as a temperature detector, wherein said object is heat-treated at an actually desired temperature by correcting the temperature of said object in accordance with the dopant concentration or resistivity of said object, and wherein the object is a silicon single-crystal substrate having a dopant concentration not hither than the maximum solubility of the dopant in silicon and a resistivity not higher than 0.01 Ω·cm.

2. A heat-treating method according to claim 1, wherein said temperature correction is performed by modifying a set value of temperature to which said object is reached in accordance with the difference between an actual temperature of said object and a measured value obtained through the radiation thermometer, the difference being determined in advance for the dopant concentration or resistivity of said object.

3. A heat-treating method according to claim 1, wherein said temperature correction is performed by modifying a measured value obtained through the radiation thermometer in accordance with the difference between an actual temperature of said object and the measured value obtained through the radiation thermometer, the difference being determined in advance for the dopant concentration or resistivity of said object.

4. A heat-treating method according to claim 1, wherein the dopant concentration of the substrate is not lower than $1 \times 10^{19}$ atoms/cm$^3$.

5. A heat-treating method according to claim 1, wherein said object is a p-type silicon single-crystal substrate.

6. A heat-treating method according to any one of claim 5, wherein said heat treatment is vapor-phase growth of a silicon single-crystal thin film on the silicon single-crystal substrate.

7. A method for heat-treating a silicon single-crystal substrate comprising:

(a) irradiating heat on the silicon single-crystal substrate with a radiant hearing device;

(b) detecting a radiation from the silicon single-crystal substrate using a radiation thermometer to produce an output signal;

(c) when a dopant concentration of the silicon single-crystal substrate is lower than $1 \times 10^{19}$ atoms/cm$^3$, controlling the irradiated heat based on the output signal of the radiation thermometer; and (d) when a dopant concentration of the silicon single-crystal substrate is not lower than $1 \times 10^{19}$ atoms/cm$^3$ and not higher than a maximum solubility of the dopant in silicon, controlling the irradiated heat based on the output signal of the radiation thermometer and a difference between the dopant concentration and $1 \times 10^{19}$ atoms/cm$^3$.

8. The method of claim 7, wherein step (d) comprises:

(e) determining a difference between an actual temperature of the silicon single-crystal substrate and the output of the radiation thermometer for the dopant concentration of the silicon single-crystal substrate; and (f) modifying a set value of a control device which indicates a temperature to be reached by the silicon single-crystal substrate based on the difference determined in step (e).

9. The method of claim 7, wherein step (d) comprises:

(g) determining a difference between an actual temperature of the silicon single-crystal substrate and the output of the radiation thermometer for the dopant concentration of the silicon single-crystal substrate; and (h) modifying the output of the radiation thermometer based on the difference determined in step (g).

10. The method of claim 7, wherein the silicon single-crystal substrate is a p-type silicon single-crystal substrate with a dopant concentration not higher than the maximum solubility of the dopant in silicon and a resistivity of no higher than 0.01 Ω·cm.

11. The method of any of claims 7–10, further comprising forming a silicon single-crystal thin film on the substrate by vapor-phase growth.

* * * * *